Oct. 8, 1968 E. S. WENDOLKOWSKI 3,405,373

VARIABLE DELAY LINE

Filed May 8, 1964

INVENTOR.
Eugene S. Wendolkowski
BY John C. McGregor
ATTORNEY 3,405,373
VARIABLE DELAY LINE Eugene S. Wendolkowski, Northport, N.Y., assignor to Computer Devices Corp., Huntington Station, N.Y., a corporation of New York Filed May 8, 1964, Ser. No. 365,876
10 Claims. (Cl. 333—29)

ABSTRACT OF THE DISCLOSURE

A distributed-constant, constant impedance, continuously variable delay line having the same impedance at the input as at the output with the input and output terminals being connected by a length of flexible conductor which is mechanically connected near one end to an insulated ground plane mandrel and near its other end to an electrically conducting shorting mandrel, with the two mandrels being adjustably rotatable, so that the conductor winds up on one mandrel while unwinding from the other, thus changing the capacitance and inductance in the same direction to change the delay time.

This invention relates to delay lines, and more particularly to distributed-constant delay lines having constant impedance and infinite resolution.

Delay lines have found increasingly wider use in present day technology as a means of accommodating, channeling and utilizing large masses of data. For example, the data received by multi-element antennas frequently must be correlated and radar signals must be time-adjusted so they can be fed into computers. Precise adjustment of variable delay times has, therefore, become more critical. Conventionally, delay lines are varied by switching over a range of discrete tap settings. Such step adjustments are not completely satisfactory as a means of coordinating different wave forms. Also, there is a tendency for mismatch problems to arise when delay lines are switch-adjusted in the conventional manner, and signal attenuation tends to be high. Satisfactorily low standing wave ratios and linearity are frequently sacrificed to achieve variability.

Accordingly, it is an object of the present invention to provide a variable delay line which overcomes the above and other disadvantages commonly associated with adjustably variable lines.

Another object of the invention is to provide an adjustable delay line affording infinite resolution and capable of maintaining constant impedance at all delay settings.

Another object of the invention is to provide an adjustable delay line which is capable of precise adjustment of phase shift at very high frequencies and which can be inserted in coaxial systems without signal degradation.

In accordance with the present invention, a distributed-constant, variable impedance delay line is formed of a delay mandrel having a ground plane separated from the signal line by an insulating or dielectric layer and about which the signal line is wound. The delay time is varied by varying the turns, thus changing the total effective line length. In one preferred embodiment of the invention a cylindrical delay mandrel for storing unused portions of the signal line, which takes the form of a flexible, uninsulated conductor, the turns of which are shorted on one mandrel. The two mandrels are driven in common, preferably through a spring-loaded system so that the turns are added to one mandrel as they are withdrawn from the other under uniform tension. In this fashion an infinite range of delay line adjustments are achieved over the operating range of the system.

The above and other features and objects of the present invention will be apparent from the following specification having reference to the accompanying drawings in which.

Figures 1, 2, 3, 4, 5, 6, 7:
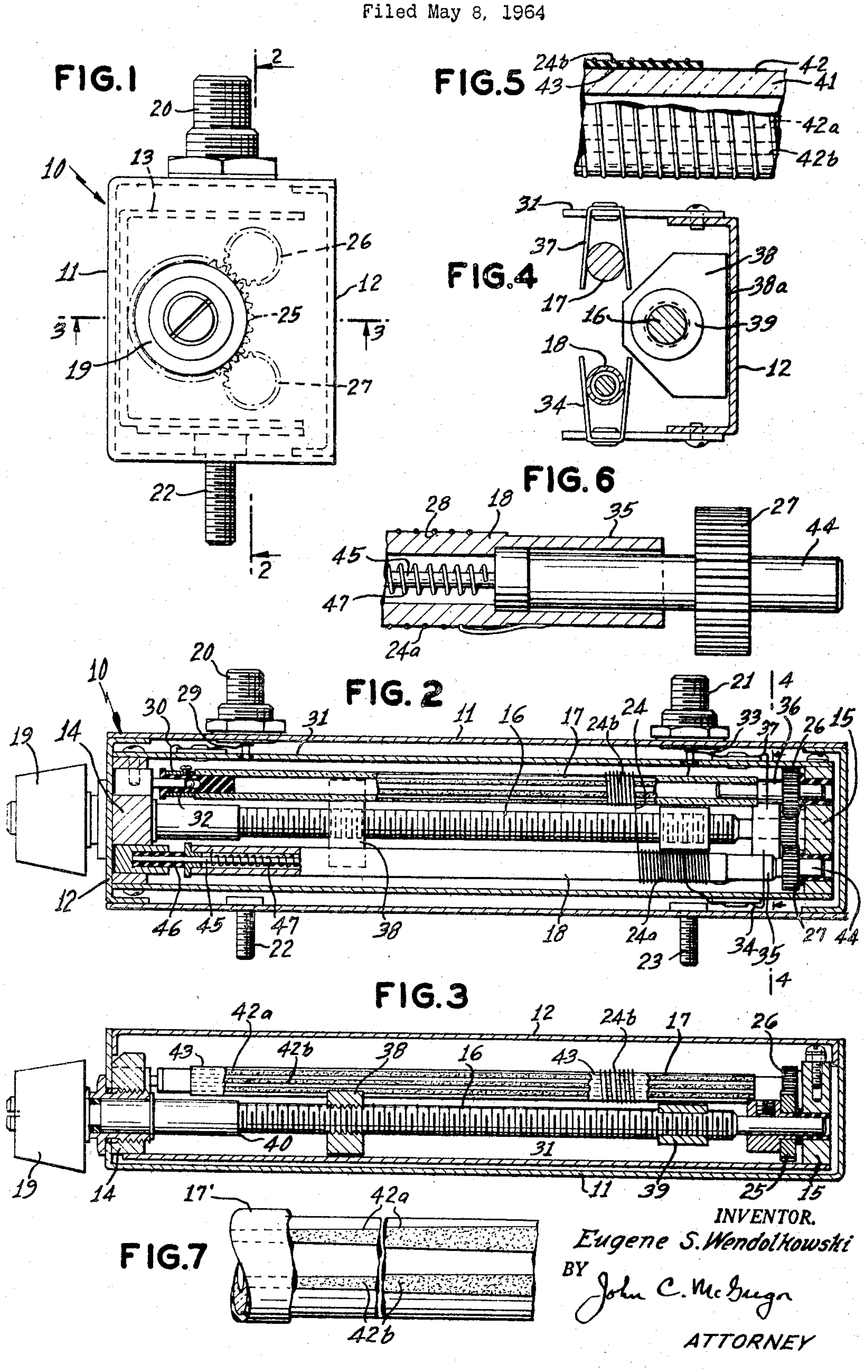
FIGURE 1 is an end view of a variable delay line formed in accordance with the present invention.
FIGURE 2 is a view in longitudinal section taken on the line 2—2 of FIGURE 1, looking in the direction of the arrows.
FIGURE 3 is a view in longitudinal section taken on the line 3—3 of FIGURE 1, looking in the direction of the arrows.
FIGURE 4 is a fragmentary view in transverse section taken on the line 4—4 of FIGURE 2, looking in the direction of the arrows.
FIGURES 5 and 6 are fragmentary sectional views in enlarged scale of portions of the delay and shorting mandrels from the delay line.
FIGURE 7 is a fragmentary enlarged view showing a delay mandrel having a nonlinear or tapered ground plane pattern.

Referring to the drawings, the present invention is illustrated and embodied in a delay line 10 having a housing 11 containing an internal frame assembly 12 which supports the moving parts of the system. The frame 12 includes an elongated, U-shaped member 13 carrying end pieces 14 and 15 in which are journaled three members in the form of a threaded drive shaft 16, a delay mandrel 17 and a shorting mandrel 18. The drive shaft 16 carries an adjusting knob 19 externally of the housing 11. Suitable signal terminals 20 and 21 and mounting lugs 22 and 23 are also mounted externally of the housing.

The signal conductor within the delay line system comprises a length of flexible electrical conductor, preferably in the form of a fine wire 24, free of electrical insulation. The electrical conductor or wire 24 is carried by both the delay and shorting mandrels 17 and 18 and is wound in inversely variable helices **24*a* and 24*b* thereon. One end of the signal wire 24 is affixed to the left-hand end of the delay mandrel 17 (as viewed in FIGURE 2) and the other end is similarly affixed to the right-hand end of the shorting mandrel 18. The two mandrels are driven from the common drive shaft 16 by a gear 25 secured to the drive shaft which meshes with a pair of gears 26 and 27 secured to the delay and shorting mandrels 17 and 18, respectively. In the illustrated arrangement the mandrels are of the same diameter and therefore carry gears of the same size so that both are driven at the same angular speed to cause the signal wire 24 to wind or unwind, as the case may be, at the same speed to maintain the bridging limb of the conductor 24** free of slack.

To closely define the pitch of the helices of the mandrels, the shorting mandrel 18 includes correspondingly pitched screw threads or grooves 28 on its external surface. In the illustrated embodiment the mandrel 18 takes the form of a metallic cylindrical sleeve which is electrical conducting so that the turns **24*a* of uninsulated wire 24** wound thereon are uniformly shorted.

An electrical circuit is completed from the terminal 20 to the secured end of the wire or conductor 24 on the delay mandrel 17 by means of a conductor 29 and an electrical brush or contact 30 carried by a sidewall 31 of the frame 12. The brush 30 engages a slip ring 32 on the delay mandrel 17 and the slip ring is in turn connected to the fixed end of the conductor wire 24 by a suitable coupling (not shown). In a like manner the terminal 21 is connected to the other end of the wire 24 to a circuit including a conductor 33, an electrical contact or brush 34 and a slip ring 35 connected by suitable means (not shown) to the other fixed end of the conductor 24.

A ground connection to the delay mandrel 17 is provided by means of a slip ring 36 and a brush or contact 37 suitably connected to the frame and to the grounded portion of the terminals.

The limits of winding motion within the system are provided by a stop mechanism in the form of a traveling nut or rider 38 mounted on the threaded drive shaft 16 and having a flat surface 38*a*, which rides along the flat, elongated surface of the frame 12, preventing rotation of the nut so that it travels axially as the shaft rotates. A stop collar or nut 39 locked on the drive shaft 16 limits the travel in one direction and a shoulder 40 limits the travel in the other direction. These stop points are so arranged that maximum utilization of the signal wire 24 is obtained, i.e. the wire is fully wound on one mandrel or the other at the extremes of travel.

The delay mandrel 17 as best seen in FIGURE 5 is formed of a ceramic sleeve or tube 41 having an electrical conducting film 42 such as silver applied to its surface in longitudinal strips 42*a*, 42*b*, et al. (FIGURE 3) and representing the ground plane of the delay line, and an insulating layer 43 overlying the ground plane. The insulating layer is of uniform thickness and is adapted to have the wire or signal conductor 24 wound thereon along a pitch axis which is determined by the piloting groove or thread 28 formed in the surface of the shorting mandrel 18. Uniform tension is maintained in the wire 24 as it spans the two mandrels by means of a spring coupling system which, in the illustrated arrangement, is interposed between the drive gear 27 and the shorting mandrel 18. To this end the gear 27 is carried by a stub shaft 44 journaled in the end piece 15 and loosely received within the tubular sleeve 18 which forms the shorting mandrel to form a bearing. A rod 45 extends the full length of the mandrel and finds a bearing in the opposite end piece 14 through a stub shaft or carrier piece for the sleeve 18. A helical spring 47 is mounted within the toroidal space between the rod 45 and the inside surface of the sleeve 18 and is joined at its right-hand end, as viewed in the drawing, to the rod 45, and at its left-hand end to the inside of the sleeve 18. Thus, as the gear 27 is rotated, the coil spring 47 is rotated and torque is applied to the shorting mandrel or sleeve 18. Uniform tension is thus maintained in the wire 24.

In operation, an input signal introduced in the terminal 20 passes through the helix or turns 24*b* on the delay mandrel 17. Inductance L results from the number of turns and distributed capacitance C results between the wire wound on the mandrel 17 and the ground plane 42. The time delay $T_d$ is a function of the inductance and capacitance, i.e. $T_d=\sqrt{LC}$ From the point at which the signal wire 24 passes from the delay mandrel a direct conducting path is provided to the output terminal 21, with all of the turns of the helix 24*a* on the mandrel 18 being fully shorted. The removal of the slightest increment of wire from the delay mandrel 17 removes a matched increment of capacitance and inductance from the system, thus producing a corresponding change in delay. The delay adjustment is therefore accomplished by turning the control knob 19, and infinite resolution with uniform line impedance result.

A typical delay-line of the type shown in FIGURE 1 had a delay range of 0 to 50 nanoseconds, an impedance of 100 ohms, and a frequency response that was flat to 50 megacycles. Full delay excursion was achieved in 60 turns of the control shaft. The dimensions of the unit were 1x1¼x5½ inches. Different delays and impedances were achieved by adjusting the thickness of the dielectric or insulating layer 43, changing wire size, changing pitch, and by varying the diameter and length of the mandrels.

It will be observed that the ground plane 42 of the delay mandrel 17 includes a series of circumferentially spaced strips 42*a*, 42*b*, et al. (FIGURE 3). This ground plane pattern is normally utilized in place of a continuous ground plane to avoid eddy current losses. In accordance with the present invention, however, it is possible to further modify the ground plane pattern, or the delay mandrel diameter, or the dielectric thickness or a combination thereof, to achieve nonlinear impedance characteristics.

Referring to FIGURE 7, there is illustrated a section of a delay mandrel 17' in which the ground plane takes the form of metallic strips 42*a'*, 42*b'*, et al., which are non-uniform in width over the length of the mandrel. For purposes of illustration this non-uniform width is illustrated in the form of a uniform taper, although it will be understood that the patterns and configurations can be used. It will be seen therefore, that as additional turns are applied to the delay mandrel 17', the capacitance will change non-linearally, i.e. each successive turn will add a different amount of capacitance to the line. If desired, the effect produced by the tapered ground plane can also be produced by putting varying thicknesses of insulation or dielectric material onto the delay line mandrel, thus producing a varying capacitance along the length of the mandrel. Alternatively, the mandrels can be tapered using a uniform insulating layer, or tapered cores can be used within the mandrel to vary the inductance.

While a preferred embodiment of the present invention has been described and illustrated herein, it will be understood that the invention can take various forms and arrangements. The invention should not, therefore, be regarded as limited except as defined by the following claims.

I claim:

1. A distributed-constant, constant-impedance continuously variable delay line having the same impedance of the input as of the output, comprising a frame, a delay line mandrel supported in the frame and having an elecrically conducting, substantially cylindrical ground plane and an electrically insulating layer overlying the ground plane; a length of flexible, electrical conductor connected at one end to said mandrel and wound in a helix thereon, whereby the capacitance between the conductor and the ground plane increases with increased turns on the mandrel with a corresponding increase in inductance to increase the delay time; a pair of terminals connected to the respective ends of the conductor; means to wind and unwind turns on and from the mandrel to respectively increase and decrease the length of said helix on said mandrel to vary the delay time; and means for short circuiting the turns unwound from said mandrel, whereby the impedance is mantained the same at the input and the output.

2. A distributed-constant, constant-impedance continuously variable delay line having the same impedance of the input as of the output, comprising a frame, a delay line mandrel supported in the frame and having an electrically conducting, substantially cylindrical ground plane and an electrically insulating layer overlying the ground plane; a length of flexible, electrical conductor connected at one end to said mandrel and adapted to be wound in a helix thereon, whereby the capacitance between the conductor and the ground plane increases with increased turns on the mandrel with a corresponding increase in inductance to increase the delay time; a pair of terminals connected to the respective ends of the conductor; means to wind and unwind turns on and from the mandrel to vary the delay time, whereby the impedance is maintained the same at the input and the output; means to support said delay mandrel rotatably in said frame, and a shorting mandrel rotatably supported in said frame adjacent said delay mandrel and having one end of said electrical conductor secured thereto and adapted to be wound thereon concomitantly with unwinding of said conductor from the delay mandrel.

3. A delay line as set forth in claim 2, said shorting mandrel being electrically conducting and adapted to short successive turn of said electrical conductor wound thereon; common drive means to rotate said shorting and delay mandrels; and spring means interposed in the drive to at least one of said mandrels to maintain uniform tension on the electrical conductor bridging the mandrels.

4. A delay line as set forth in claim 3, said mandrels being substantially cylindrical and disposed side by side, and rotatable about laterally spaced-apart, parallel axes, the respective ends of said electrical conductor being connected to opposite ends of the two mandrels; threaded guide means on said shorting mandrel to control the pitch of the helices wound and unwound, respectively, on and from said mandrels; a pair of slip rings carried, respectively, by the mandrels and connected to the respective ends of the electrical conductor and electrical contacts carried by the frame and engaging said slip rings, said contacts being connected, respectively, to said terminals.

5. A variable delay line as set forth in claim 4, said shorting mandrel comprising a hollow, cylindrical member of electrical conducting material having a spiral groove formed on its exterior surface; said spring means to maintain uniform tension comprising a coil spring received within the cylinder and joined to the cylinder at one end and joined to said drive means at its other end.

6. A delay line as set forth in claim 5, including a drive shaft rotatably supported in said frame adjacent said mandrels and parallel thereto; and means coupling said shaft to both of said mandrels.

7. A delay line as set forth in claim 6, said drive shaft having screw threads formed thereon, a traveling nut mounted on said shaft engaging said threads; and axially spaced stop members interposed in the path of travel of said nut to limit the coiling and uncoiling of said electrical conductor.

8. A distributed-constant, constant-impedance continuously variable delay line having the same impedance of the input as of the output, comprising a frame, a delay line mandrel supported in the frame and having an electrically conducting, substantially cylindrical ground plane and an electrically insulating layer overlying the ground plane; a length of flexible, electrical conductor connected at one end to said mandrel and adapted to be wound in a helix thereon, whereby the capacitance between the conductor and the ground plane increases with increased turns on the mandrel with a corresponding increase in inductance to increase the delay time; a pair of terminals connected to the respective ends of the conductor; means to wind and unwind turns on and from the mandrel to vary the delay time, whereby the impedance is maintained the same at the input and the output; and means to vary the impedance characteristics of the line non-linearly with changes in turns on the mandrel.

9. A distributed-constant, constant-impedance continuously variable delay line having the same impedance of the input as of the output, comprising a frame, a delay line mandrel supported in the frame and having an electrically conducting, substantially cylindrical ground plane and an electrically insulating layer overlying the ground plane; a length of flexible, electrical conductor connected at one end to said mandrel and adapted to be wound in a helix thereon, whereby the capacitance between the conductor and the ground plane increases with increased turns on the mandrel with a corresponding increase in inductance to increase the delay time; a pair of terminals connected to the respective ends of the conductor; means to wind and unwind turns on and from the mandrel to vary the delay time, whereby the impedance is maintained the same at the input and the output; said delay mandrel comprising a ceramic cylinder; an electrically conducting layer on the outer surface of said cylinder; and an electrically insulating layer surrounding said conducting layer.

10. A delay line as set forth in claim 8, said electrically conducting layer comprising longitudinal strips of non-uniform width.

References Cited

UNITED STATES PATENTS

| | | | |
|---|---|---|---|
| 2,943,276 | 6/1960 | Lovick | 333—29 |
| 3,212,030 | 12/1965 | Gordon | 333—31 |
| 3,173,111 | 3/1965 | Kallman | 333—31 |

HERMAN KARL SAALBACH, *Primary Examiner.*

C. BARAFF, *Assistant Examiner.*